United States Patent
Houston et al.

[11] Patent Number: 6,114,044
[45] Date of Patent: Sep. 5, 2000

[54] METHOD OF DRYING PASSIVATED MICROMACHINES BY DEWETTING FROM A LIQUID-BASED PROCESS

[75] Inventors: Michael R. Houston, Berkeley; Roger T. Howe, Lafayette; Roya Maboudian, Orinda; Uthara Srinivasan, Berkeley, all of Calif.

[73] Assignee: Regents of the University of California, Oakland, Calif.

[21] Appl. No.: 08/866,833

[22] Filed: May 30, 1997

[51] Int. Cl.[7] ..................................................... B32B 9/04
[52] U.S. Cl. ............................... 428/447; 216/74; 216/96; 310/309; 427/309; 427/352; 427/354; 427/443.2; 427/58
[58] Field of Search ................................. 216/79, 99, 74, 216/96; 310/309; 427/309, 58, 352, 354, 435, 443.2; 428/447, 450

[56] References Cited

U.S. PATENT DOCUMENTS

| | | | |
|---|---|---|---|
| 5,403,665 | 4/1995 | Alley et al. | 428/447 |
| 5,411,769 | 5/1995 | Hornbeck | 427/534 |
| 5,512,374 | 4/1996 | Wallace et al. | 428/422 |
| 5,683,591 | 11/1997 | Offenberg | 216/79 X |

*Primary Examiner*—Michael Lusignan
*Attorney, Agent, or Firm*—William S. Galliani; Flehr Hohbach Test Albritton & Herbert LLP

[57] ABSTRACT

A method of fabricating a micromachine includes the step of constructing a low surface energy film on the micromachine. The micromachine is then rinsed with a rinse liquid that has a high surface energy, relative to the low surface energy film, to produce a contact angle of greater than 90° between the low surface energy film and the rinse liquid. This relatively large contact angle causes any rinse liquid on the micromachine to be displaced from the micromachine when the micromachine is removed from the rinse liquid. In other words, the micromachine is dried by dewetting from a liquid-based process. Thus, a separate evaporative drying step is not required, as the micromachine is removed from the liquid-based process in a dry state. The relatively large contact angle also operates to prevent attractive capillary forces between micromachine components, thereby preventing contact and adhesion between adjacent microstructure surfaces. The low surface energy film may be constructed with a fluorinated self-assembled monolayer film. The processing of the invention avoids the use of environmentally harmful, health-hazardous chemicals.

29 Claims, 3 Drawing Sheets

METHOD OF DRYING PASSIVATED MICROMACHINES BY DEWETTING FROM A LIQUID-BASED PROCESS

This invention was made with Government support under Grant (Contract) No. DE-AC04-94AL85000 awarded by the Department of Energy. The Government has certain rights to this invention.

BRIEF DESCRIPTION OF THE INVENTION

This invention relates generally to miniature instruments commonly called micromachines. More particularly, this invention relates to a method of obtaining a dry and passivated micromachine from a liquid-based process.

BACKGROUND OF THE INVENTION

Micromachines (also called micomechanical devices or microelectro-mechanical devices) are small (micron scale) machines which promise to miniaturize instrumentation in the same way microelectronics have miniaturized electronic circuits. Micromachines include a variety of devices such as motors and gear trains analogous to conventional macroscale machinery. As used herein, the term micromachine refers to any three-dimensional object having one or more sub-millimeter dimensions.

"Stiction" is a fundamental problem associated with micromachines. Stiction most often manifests itself during the structure release process, where liquid capillary forces deflect compliant structures into contact with adjacent surfaces. Subsequent evaporative drying leads to solid bridging due to precipitates left behind from the liquid phase, which usually results in permanent sticking and device failure. This release-related stiction has been successfully circumvented by several methods, including sublimation drying, supercritical drying, and dry-release techniques that avoid the formation of a liquid-vapor interface altogether. In addition, small features have been added to the microstructure perimeter to reduce capillary have been shaping the liquid meniscus. However, these techniques have yet to be widely adopted commercially, either due to process equipment issues or inferior performance in terms of stiction reduction.

The second manifestation of stiction is during actual device operation termed, in-use stiction. When adjacent microstructure surfaces come into contact, capillary, electrostatic, and van der Waals forces may all contribute to adhesion of the surfaces and device failure. None of these techniques mentioned above for the alleviation of release stiction addresses the problem of in-use stiction, which is becoming more important as increasingly compliant microstructures are introduced. Initial attempts to alleviate in-use stiction focused on reducing the contact area between adjacent surfaces by fabricating micro-dimples or by roughening the polysilicon surface on a more microscopic level. While some improvements (a factor of approximately 5) were seen due to roughening, attention has turned more recently towards chemical passivation of the polysilicon surface.

One approach to surface passivation uses self-assembled monolayers (SAMs) constructed on microfabricated devices. This technique is described by Alley, et. al. in U.S. Pat. No. 5,403,665 (the '665 patent). The process of the '665 patent entails an evaporative or supercritical-fluid drying step after the liquid-based processing used to construct the self-assembled monolayer passivation film.

The technology described in the '665 patent solved many problems in the prior art. However, there are still a number of shortcomings associated with the technology of the '665 patent. One problem associated with the '665 patents is that it requires an evaporative drying step. This step constitutes an additional processing step, thus it adds time and expense to the fabrication of a device. In addition, the evaporative drying step proposed in the '665 patent produces little or no improvement over uncoated structures with respect to release related stiction. Other suggested drying approaches such as supercritical-fluid or freeze-sublimation drying require expensive, hard-to-obtain, non-standard processing equipment. In addition, the '665 patent includes processing steps that use chloroform and carbon tetrachloride, substances which are hazardous to health and the environment. As a result, these substances have been banned from industrial use by the Montreal protocol.

In view of the foregoing, it would be highly desirable to provide an improved technique for passivating and drying micromachines. In particular, it would be highly desirable to improve micromachine passivation coatings, improve the drying step associated with the construction of such coatings, and to eliminate the use of environmentally harmful and health-hazardous substances commonly employed in the construction of such coatings.

SUMMARY OF THE INVENTION

A method of fabricating a micromachine includes the step of constructing a low surface energy film on the micromachine. The micromachine is then rinsed with a rinse liquid that has a high surface energy, relative to the low surface energy film, to produce a contact angle of greater than 90° between the low surface energy film and the rinse liquid. This relatively large contact angle causes any rinse liquid on the micromachine to be displaced from the micromachine when the micromachine is removed from the rinse liquid. In other words, the micromachine is dried by dewetting from a liquid-based process. Thus, a separate evaporative drying step is not required, as the micromachine emerges from the liquid-based process in a dry state. The relatively large contact angle (greater than 90°) also operates to prevent attractive capillary forces between micromachine components, thereby reducing both release-related and in-use stiction. The low surface energy film may be constructed with a fluorinated self-assembled monolayer film. The processing of the invention avoids the use of environmentally harmful and health-hazardous chemicals.

BRIEF DESCRIPTION OF THE DRAWINGS

For better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
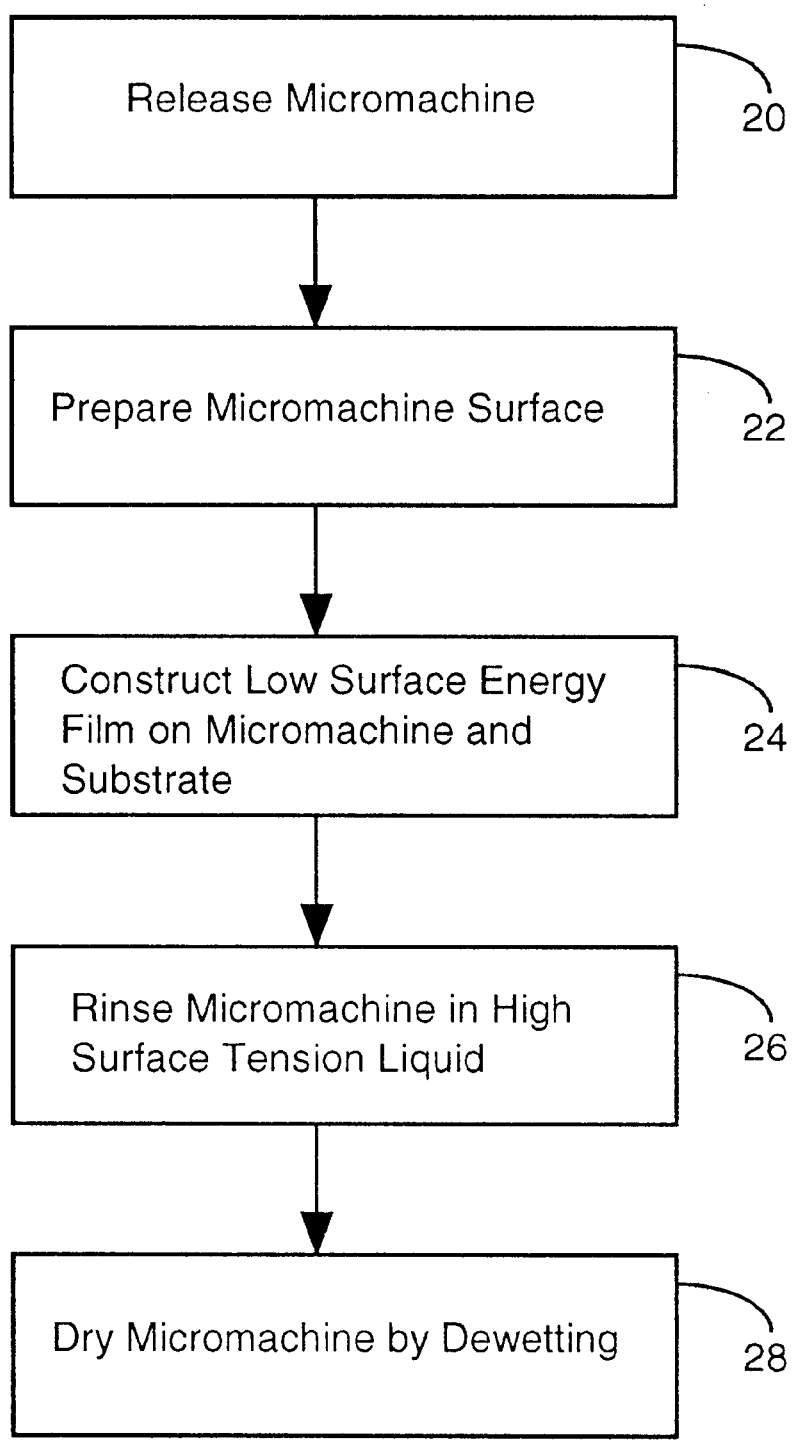
FIG. 1 illustrates general processing steps associated with an embodiment of the invention.

FIG. 1 illustrates processing steps associated with an embodiment of the invention. The first processing step is to release a micromachine (step 20), a well-known step that is discussed below. The subsequent processing step is to prepare the micromachine surface for the construction of a passivation film (step 22). This processing step is generally consistent with prior art techniques, but eliminates the use of environmentally dangerous and health-hazardous substances associated with prior art techniques, as discussed below.

The next processing step is to construct a low surface energy film on the micromachine and its associated substrate (step 24). The low surface energy film operates as a passivation coating for the micromachine. As used herein, a passivation coating refers to any coating that protects an underlying substrate from contamination, reduces adhesion between contacting surfaces, and/or produces a chemically inert surface. As discussed below, embodiments of the invention include passivation coatings that are low surface energy films. The low surface energy films enable drying by dewetting and reduce both release and in-use stiction problems. The low surface energy films may be implemented as self-assembled monolayer films, in which case they operate as low adhesion surfaces, thereby providing a lubrication effect for the micromachines. Examples of low surface energy films and their characteristics are discussed at length below.

The next processing step is to rinse the micromachine in a high surface energy liquid (step 26), or rinse liquid. As used herein, a high surface energy liquid refers to a liquid that produces a contact angle greater than 90° on a substrate surface. Water is an example of a rinses liquid with a high surface energy. Rinse liquid operations and contact angles are defined with respect to the figures below.

The absolute values for the low surface energy film and the high surface energy liquid are not critical, what is critical is their relative values. That is, their relative values should result in a contact angle between the low surface energy film and the high surface energy liquid of greater than 90°, preferably the contact angle is as high as possible. The invention has been regularly practiced with contact angles between approximately 110–116°, commonly at approximately 114°. In accordance with the invention, a relatively large contact angle may be established by surface chemical treatment and/or surface roughening techniques.

A contact angle of this type insures that the meniscus of the rinse liquid does not create an attractive capillary force that collapses microstructures associated with the micromachine. In addition, the contact angle causes the rinse liquid to be displaced from the micromachine by vapor when the micromachine is removed from its liquid-based processing. As a result, extremely compliant structures may be pulled directly out of a rinse liquid, from which they emerge released and completely dry without a post-processing evaporative drying step. Thus, FIG. 1 illustrates that the last processing step is to dry the micromachine by dewetting (step 28). As used herein, the term dewetting refers to a drying process that does not rely primarily on evaporative drying, but on a dynamic displacement of the liquid with vapor with the aid of some force, such as a gravitational force. While dewetting does occur between liquids and solid surfaces exhibiting contact angles less than 90°, dewetting under these circumstances is incomplete on surfaces possessing three dimensional structures and in any case results in attractive capillary forces which leads to stiction in micromachines.

Those skilled in the art will recognized number of benefits associated with the description of the general process of FIG. 1. One important benefit is that the micromachine emerges from its liquid-based processing in a dry state. Thus, a discrete evaporative drying step is not required. This feature simplifies micromachine processing and otherwise reduces the possibility of damaging a micromachine during a heating operation. Another benefit associated with the invention relates to its use of environmentally safe substances. This benefit and other benefits of the invention are more fully appreciated with reference to FIG. 2.

Figure 2:
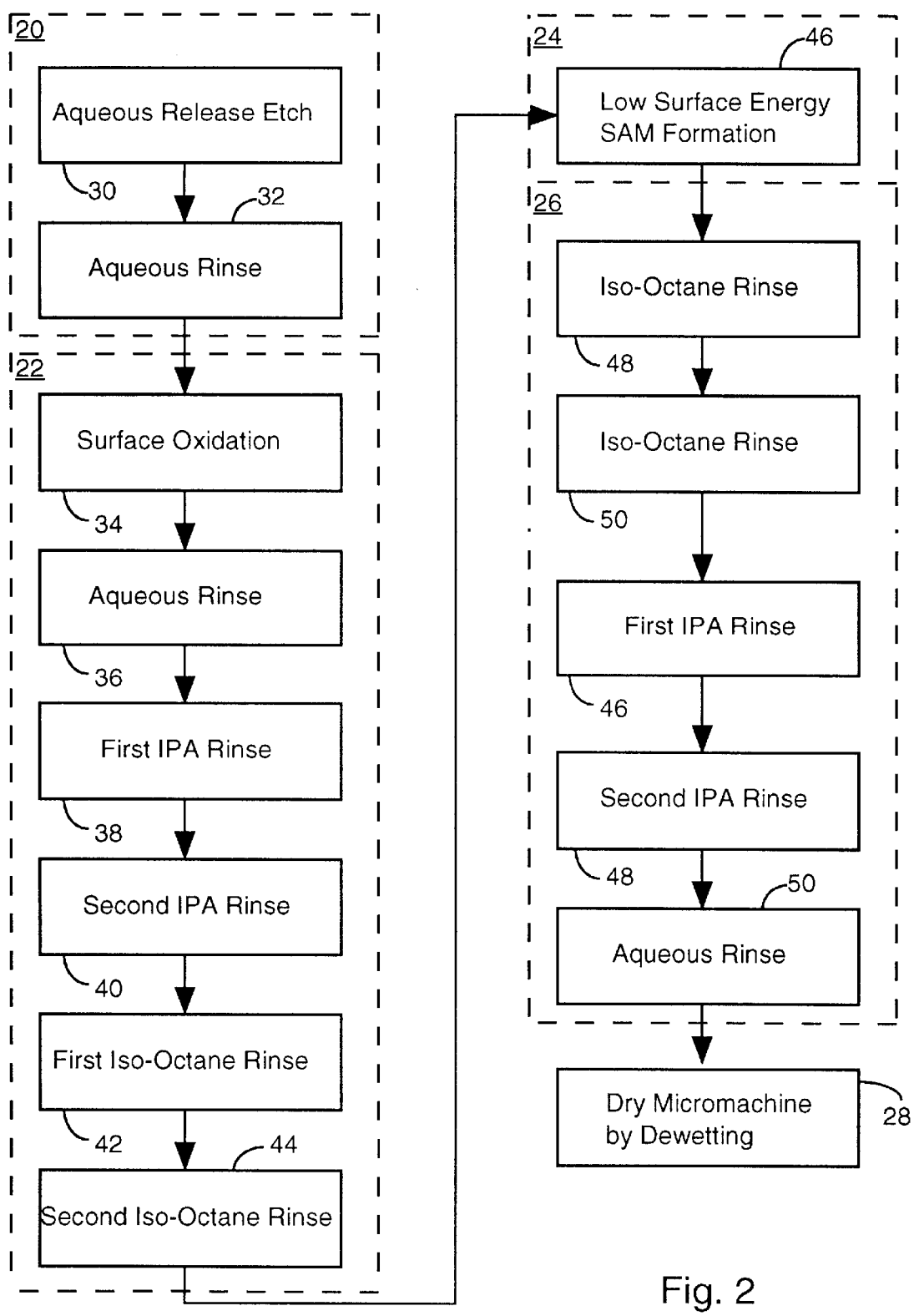
FIG. 2 illustrates more detailed processing steps associated with the process of FIG. 1.

FIG. 2 is a more detailed description of the processing described in FIG. 1. FIG. 2 illustrates that the micromachine release step (step 20) may be implemented as a liquid-based process. In particular, the micromachine release step may be implemented with an aqueous release etch (step 30). This step may be performed with hydrofluoric (HF) acid (e.g., dilute HF (5:1 v/v $H_2O$) acid for 15 minutes). As appreciated by those skilled in the art, the duration of the release etch stop depends on the details of the etch mixture, the sacrificial layer composition, the sacrificial layer thickness, and the device dimensions.

The next step associated with FIG. 2 is an aqueous rinse (step 32). In general, this will entail an approximately 15 minute aqueous rinse to remove any remaining HF etchant.

The micromachine release step (step 20) may also be implemented as a dry process, for example, by using photoresist ashing. Such a process does not alter the fundamental characteristics of the invention.

As shown in FIG. 2, the micromachine surface preparation step (step 22) may include a surface oxidation step (step 34). This may be accomplished with a 30% $H_2O_2$ soak for approximately 15 minutes. This step may be followed by an aqueous rinse (step 36) in $H_2O$ for approximately 10 minutes. This step may be followed by two iso-proponal (IPA) rinses (steps 38 and 40). Thereafter, a first iso-octane rinse (step 42) for five minutes and a second iso-octane rinse (step 44) for five minutes is performed. The IPA and iso-octane operate to remove all water from the micromachine surfaces. The prior art relies upon $CCL_4$, an environmental and health hazardous substance, to perform this function. The present invention avoids the use of this harmful substance by relying upon iso-octane to perform the same function.

The next processing step shown in FIG. 2 relates to the construction of a low surface energy film on the micromachine and accompanying substrate (step 24). This step may be performed as a single-step process of forming a low surface energy self-assembled monolayer (SAM) (step 46). This step has been performed using octadecyltrichlorosilane (OTS) precursor molecules. For example, a 0.5 mM of octadecyltrichlorosilane in a 4:1 volume mixture of hexadecane and chloroform may be used for a soak lasting 15 minutes. In a preferable embodiment, a fluorinated self-assembled monolayer is used. For example a 1mM 1H, 1H, 2H, 2H-perfluorodecyltrichlorosilane (FDTS, $C_8F_{17}(CH_2)_2SiCl_3$) solution in iso-octane may be used. The solution should be mixed and used in a highly water-sensitive headgroup.

The SAM formation step (step 46) is followed by the step of rinsing the micromachine in a high step (step 26). This step may include a first iso-octane rinse (step 48) and a second iso-octane rinse (step 50), each of which may be for five minutes. The rinse operation removes excess precursors. Once again, iso-octane is used. Thus, an environmentally hazardous substance, such as $CCl_4$ or $CHCl_3$ (chloroform) is avoided. A first iso-proponal rinse (step 46) for approximately 5 minutes and a second iso-proponal rinse (step 48) for approximately 5 minutes is then performed. This operation is followed by the an aqueous rinse (step 50). The aqueous rinse may be performed with $H_2O$ for approximately 5 minutes.

At this point, the micromachine can be lifted from its liquid-based process. This results in the drying of the micromachine by dewetting (step 28). The contact angle between the low surface energy film and the rinse liquid causes the rinse liquid to bead-up and fall-off the micromachine. As discussed below, the relatively large contact angle also results in a rinse liquid meniscus with a convex curvature, which prevents attractive forces between two surfaces and the subsequent release-related stiction. Such results are not available in the prior art because a contact angle of greater than 90° is not achieved. For example, the processing described in the '665 patent results in a contact angle substantially below 90°, or requires the use of elaborate drying techniques, such as supercritical-fluid or freeze-sublimation drying, to produce a working micromachine.

Figure 3:
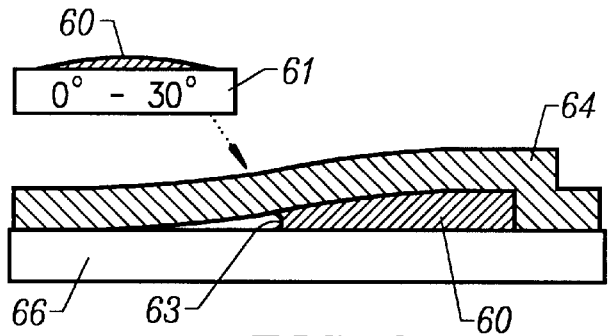
FIG. 3 illustrates the capillary forces associated with a rinse liquid and a hydrophilic surface of the prior art.
Figure 4:
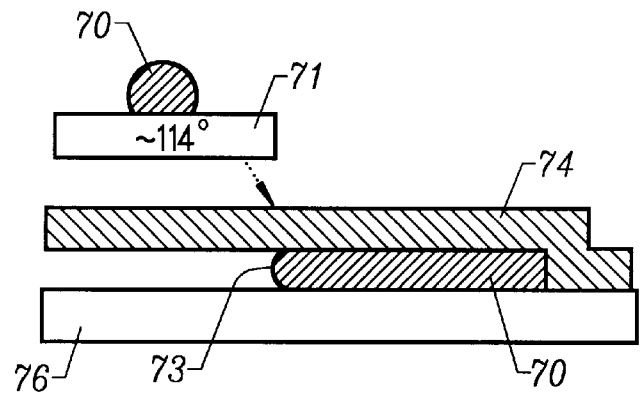
FIG. 4 illustrates a convex meniscus curvature associated with a rinse liquid and highly hydrophobic film of the invention, which operate to reduce stiction problems in a micromachine.

FIGS. 3 and 4 demonstrate the physical phenomenon associated with the interactions between a rinse liquid and a micromachine. In FIG. 3, a rinse liquid 60 and hydrophilic surface 61 create a contact angle of between 0 and 30°. The contact angle is marked in the figures as θ. A contact angle of this type results in a concave meniscus 63 underneath a beam 64 of a micromachine. The concave meniscus creates a capillary force which acts to bring the beam 64 into contact with the substrate 66. As given by the well-known LaPlace equation:

$$P_L = P_2 - P_1 = (2\gamma_1 \cos\theta)/d$$

In contrast, FIG. 4 illustrates a rinse liquid 70 and a highly hydrophobic surface 71 that create a contact angle of approximately 114°, in accordance with the invention. This results in a convex meniscus 73 underneath a SAM-coated beam 74 of a micromachine. The convex meniscus does not create an attractive force with the SAM-coated substrate 76, as can be seen by the LaPlace equation when calculated with a radius of curvature with an opposite sign.

The invention has now been fully described. Attention presently turns to a discussion of particular embodiments, attributes and benefits of the invention. The stiction data presented below were taken from arrays of cantilever beams 2 µm thick and 10 µm wide, ranging from 50 to 1000 µm in length and nominally offset 2 µm above a polysilicon ground plane.

In order to qualify in-use stiction, beams longer than 400 µm were brought into contact with the underlying substrate by applying a voltage of 150 V to a narrow actuation pad near the anchor region. Shorter beams were depressed with a sharp tungsten probe tip. After the actuation force was removed, the lengths of beams that remained struck to the substrate were recorded. Sticking probabilities for each beam length and surface coating were calculated and used to find the apparent work of adhesion, the energy required to separate two surfaces from contact.

The thermal stability of the coatings was tested using a rapid thermal annealing system operating at atmospheric pressure. For studies in $N_2$, the sample chamber was first purged with 50 sccm of the gas for five minutes. Contact angle data were taken with DI water (resistivity>18 MΩ) and spectroscopic grade hexadecane according to the sessile droplet method with a Rame-Hart goniometer. Droplet size was approximately 4 µl. An atomic force microscope was used to image the microstructure surfaces and quantify their roughness.

The topography of the contacting surfaces is critical to adhesion and friction at the microscale. Surface texture determines the real area of contact which, in lightly loaded MEMS, may be a very small fraction of the apparent area. The rms roughness of the surface is 12 nm for the as-deposited polysilicon in these structures.

As indicated above, due to the highly hydrophobic nature of the FDTS SAMs, the coated microstructures emerge from the final water wash completely dry. 98% of the beams up to 1 mm in length and approximately 90–95% of those between 1 and 2 mm long were released successfully. This compares favorably to results from the prior art method of the '665 patent in which structures longer than about 200 µm could not be tested due to sticking caused by the evaporative drying process.

The OTS coating resulted in a 112° coated angle with water and a 38° contact angle with Hexadecane, while the FDTS coating resulted in a 115° contact angle with water and a 68° contact angle with Hexadecane. This information confirms that well-packed monolayers were formed. When a polar solvent such as water is used as the test liquid, the contact angle is primarily a measure of the surface polarity. Here, both SAMs are almost equally nonpolar so the water contact angles are similar. On the other hand, when the test liquid is nonpolar, as with hexadecane, the contact angle reflects the van der Waals attractions to the surface. Since the CF bond has a lower polarizability than CH, a perfluorinated surface is less susceptible to induced dipole attractions that its hydrogenated counterpart. Thus, the hexadecane contact angle on the FDTS SAM is higher.

Figure 5:
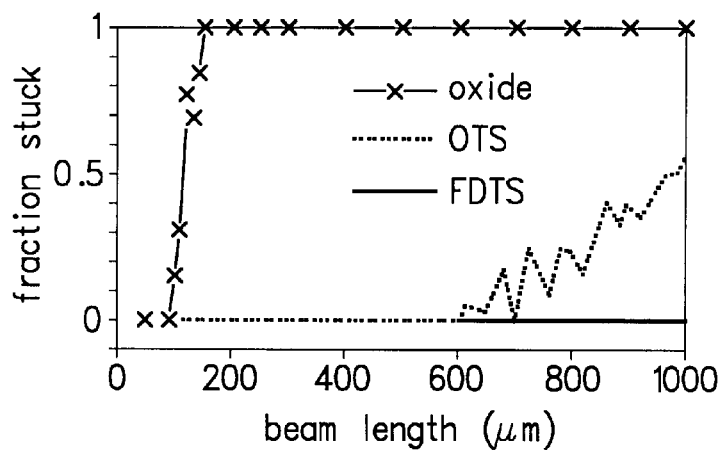
FIG. 5 is a sticking probability plot for FDTS and OTS SAM films applied to a polysilicon device constructed in accordance with an embodiment of the invention.

Upon electrostatic actuation to contact the underlying substrate, the 1000 µm long beams of the FDTS-coated structures did not remain stuck. Thus, the fluorinated SAM films reduce adhesion below the measurement capabilities of this set of test structures, with the apparent work of adhesion less than 2.4 µJ/m². This value is about four orders of magnitude lower than that of the $SiO_2$ coating (approximately 20 mJ/m²), a reduction mainly caused by the elimination of water capillary attractions. Sticking probability data for FDTS and OTS SAM-coated beams are shown in FIG. 5. The adhesional energy between the SAM-coated surfaces is ideally due to van der Waals attractions, so the lower polarizability of perfluorinated surfaces versus hydrogenated ones may be responsible for the difference in the in-use stiction behaviors of the two coatings. With regard to long-term stability, all FDTS SAM-coated beams remained unstuck following actuation after four months of storage in room air.

Most packaging processes include processing steps at elevated temperatures, thus thermal stability is very important. Using contact angle measurements, it was determined that the FDTS films survive heat treatment at 400° C. in air while the OTS coatings degrade in air above 100° C. Stiction tests on FDTS-treated beam arrays confirmed this stability; tests on arrays heated to 400° C. in air and 500° C. in $N_2$ resulted in the same behavior after actuation as unheated FDTS-coated controls. When the polysilicon arrays were heated to 550° C. in $N_2$ and tested immediately, beams longer than 800 µm adhered to the substrate. After a day of storage in room air, the transition length decreased to 400 µm, indicating further degradation.

As indicated above, one embodiment of the invention uses octadecyltrichlorosilane (OTS) precursor molecules. When the precursor molecules are placed into a suitable solvent and an oxidized silicon surface is inserted, the trichlorosilane head groups hydrolyze and chemisorb to the surface, forming Si-O-Si links to the surface. After formation, the film is further stabilized by cross-linking between chains, a process often aided by a low temperature anneal after film formation (at approximately 100° C.). When prepared correctly, a SAM-coated Si(100) oxide surface (prepared using OTS) exhibits a water contact angle of 114°±2°. The film thickness is about 25Å, and the film "density" is approximately 5 chains per $nm^2$ (approximately 90% of the density of crystalline polyethylene), indicative of true monolayer coverage.

There are two particularly factors involved in obtaining high-quality SAM films. First, the presence of water in the SAM solution is undesirable because water will cause conglomeration of the OTS precursor molecules. Water is thought to be necessary, however, in the form of a thin film on the silicon dioxide surface. This water is responsible for hydrolyzing the trichlorosilane head groups and may promote mobility of the SAM chains, allowing them to move into close-packed structures. Thus, while bulk water must be washed away before placing samples into the SAM solution, hydrophilic silicon surfaces which retain a thin layer of water molecules are desirable for high-quality SAM films formed from these precursor species.

The second important factor in obtaining high-quality films is the temperature at which the films are formed. Specifically, a transition temperature has been observed near room temperature, below which the SAM films display superior properties. In general, this transition temperature drops as the tail chain length becomes shorter. For OTS, the transition temperature is reported to be approximately 28° C. The existence of such a transition temperature also appears to have important ramifications for forming SAM films from the precursor species, such as fluorinated trichlorosilanes.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

We claim:

1. A method of fabricating a micromachine, said method comprising the steps of:
    constructing a low surface energy film on said micromachine in a liquid-based process; and
    rinsing said micromachine with a rinse liquid that has a high surface energy relative to said low surface energy film, such that a contact angle between said low surface energy film and said rinse liquid causes said rinse liquid on said micromachine to be displaced from said micromachine when said micromachine is removed from said rinse liquid, thereby drying said micromachine without an evaporation operation.

2. The method of claim 1 further comprising the step of releasing a protective sacrificial layer from said micromachine prior to said constructing step.

3. The method of claim 2 wherein said releasing step is performed in a liquid-based proces.

4. The method of claim 3 wherein said releasing step includes the steps of using an aqueous release etch; and employing an aqueous rinse after said using step.

5. The method of claim 2 wherein said releasing step is performed in a dry process.

6. The method of claim 1 further comprising the step of preparing micromachine surfaces prior to said constructing step.

7. The method of claim 6 wherein said preparing step includes the step of oxidizing micromachine surfaces.

8. The method of claim 7 wherein said preparing step includes the step of executing an aqueous rinse after said oxidizing step.

9. The method of claim 7 wherein said preparing step includes the step of executing iso-propanol (IPA) rinse after said oxidizing step.

10. The method of claim 9 wherein said preparing step includes the step of executing iso-octane rinse after said executing step.

11. The method of claim 1 wherein said constructing step and said rinsing step result in a contact angle between said low surface energy film and said rinse liquid of greater than 90°.

12. The method of claim 11 wherein said constructing step and said rinsing step result in a contact angle between said low surface energy film and said rinse liquid of between 110–116°.

13. The method of claim 1 wherein said constructing step includes the step of forming said low surface energy film with a fluorinated self-assembled monolayer film.

14. The method of claim 13 wherein said constructing step includes the step of forming said low surface energy film with 1H, 1H, 2H, 2H-perfluorodecyltrichloro-silane (FDTS, $C_8F_{17}(CH_2)_2SiCl_3$).

15. The method of claim 13 wherein said constructing step includes the step of forming said low surface energy film with a hydrogenated self-assembled monolayer film.

16. The method of claim 15 wherein said constructing step includes the step of forming said low surface energy film with octadecyltrichlorosilane precursor molecules.

17. The method of claim 11 wherein said constructing step includes the step of rinsing said hydrophobic film with iso-octane.

18. The method of claim 18 wherein said rinsing step includes an iso-propanol (IPA) rinse.

19. The method of claim 18 wherein said rinsing step includes an aqueous rinse.

20. A micromachine formed in accordance with the method of claim 1.

21. A micromachine formed in accordance with the method of claim 10.

22. A micromachine formed in accordance with the method of claim 11.

23. A micromachine formed in accordance with the method of claim 13.

24. A micromachine formed in accordance with the method of claim 16.

25. A method of fabricating a micromachine, said method comprising the steps of:
    constructing a fluorinated self-assembled monolayer coating on said micromachine; and
    rinsing said fluorinated self-assembled monolayer coating with a rinse liquid that has a high surface energy relative to said fluorinated self-assembled monolayer coating, such that a contact angle between said fluorinated self-assembled monolayer coating and said rinse liquid causes said rinse liquid on said micromachine to be displaced from said micromachine when said micromachine is removed from said rinse liquid, thereby drying said micromachine without an evaporation operation.

26. The method of claim 25 wherein said constructing step includes the step of using 1H, 1H, 2H, 2-perfluorodecyltrichorosilane (FDTS, $C_8F_{17}(CH_2)_2SiCl_3$).

27. The method of claim 25 wherein said constructing step includes the step of using octadecyltrichlorosilane precursor molecules.

28. The method of claim 25 wherein said constructing step and said rinsing step result in contact angle between said fluorinated self-assembled monolayer coating and said rinse liquid of greater than 90°.

29. A micromachine formed in accordance with the method of claim 25.

* * * * *